(12) United States Patent
Norman et al.

(10) Patent No.: US 7,279,787 B1
(45) Date of Patent: Oct. 9, 2007

(54) MICROELECTRONIC COMPLEX HAVING CLUSTERED CONDUCTIVE MEMBERS

(75) Inventors: Richard S. Norman, 1877 Poissant Rd., Sutton, Quebec JOE 2KO (CA); David Chamberlain, Verdun (CA)

(73) Assignee: Richard S. Norman, Sutton, Quebec (CA)

( * ) Notice: Subject to any disclaimer, the term of this patent is extended or adjusted under 35 U.S.C. 154(b) by 588 days.

(21) Appl. No.: 10/330,234

(22) Filed: Dec. 30, 2002

Related U.S. Application Data

(60) Provisional application No. 60/343,219, filed on Dec. 31, 2001.

(51) Int. Cl.
*H01L 23/52* (2006.01)
*H01L 23/48* (2006.01)
*H01L 29/40* (2006.01)
*H05K 7/20* (2006.01)
*F25B 21/02* (2006.01)

(52) U.S. Cl. ......... 257/691; 257/E23.08; 257/E23.082; 257/690; 257/696; 257/692; 257/698; 257/203; 257/207; 257/208; 257/211; 257/773; 257/786; 257/780; 361/704; 361/708; 361/710; 361/719; 165/185; 165/80.3; 165/104.33; 62/3.2; 62/3.3; 62/3.7; 62/259.2; 714/13

(58) Field of Classification Search .......... 257/E23.08, 257/E23.082, 712, 713, 690–693, 696, 698, 257/786, 773, 780, 203, 207, 208, 211; 361/704, 361/708, 710, 719; 165/185, 80.3, 104.33; 714/13; 65/3.2, 3.3, 3.7, 259.2
See application file for complete search history.

(56) References Cited

U.S. PATENT DOCUMENTS

| | | | |
|---|---|---|---|
| 3,999,105 A | 12/1976 | Archey et al. | |
| 4,866,507 A | 9/1989 | Jacobs et al. | |
| 5,212,403 A * | 5/1993 | Nakanishi et al. | 257/664 |
| 5,444,531 A * | 8/1995 | Foreman et al. | 356/341 |
| 5,478,781 A | 12/1995 | Bertin et al. | |
| RE35,566 E * | 7/1997 | Boyer et al. | 356/72 |
| 5,737,171 A | 4/1998 | Buller et al. | |
| 6,183,267 B1 | 2/2001 | Marcus et al. | |
| 6,396,145 B1 * | 5/2002 | Nagai et al. | 257/737 |
| 6,916,719 B1 * | 7/2005 | Knight et al. | 438/381 |
| 2001/0035586 A1 | 11/2001 | Nakamura et al. | |

(Continued)

FOREIGN PATENT DOCUMENTS

EP 0 331 245 A2 9/1989

(Continued)

*Primary Examiner*—Alexander Oscar Williams

(57) ABSTRACT

A microelectronic complex including a body of semi-conductor material containing an integrated circuit, and a plurality of contact pads on the body for receiving signal conducting members for connection to an external substrate. The contact pads allow signals to be exchanged between the integrated circuit and the external substrate via the signal conducting members. A majority of the contact pads are disposed on the body of the microelectronic complex according to a configuration whereby the stress effects on the signal conducting members caused by thermal expansion mismatch between the microelectronic complex and the external substrate are minimized. In a specific configuration, a majority of the contact pads form a cluster circumscribing a predetermined area of the microelectronic complex body, whereby the cluster is characterized by a minimum inter-pad distance among the majority of contact pads on the body of the microelectronic complex.

19 Claims, 7 Drawing Sheets

U.S. PATENT DOCUMENTS

2005/0017750 A1 * 1/2005 Khandros et al. ........... 324/765

FOREIGN PATENT DOCUMENTS

| JP | 61265842 A | 11/1986 |
| --- | --- | --- |
| JP | 02056918 A | 2/1990 |
| JP | 06112356 A | 4/1994 |
| JP | 07226404 A | 8/1995 |
| JP | 10092865 A | 4/1998 |
| JP | 11297892 A | 10/1999 |
| JP | 2000049254 A | 2/2000 |
| JP | 2000294519 A | 10/2000 |
| JP | 2000323510 A | 11/2000 |
| JP | 2001077224 A | 3/2001 |

* cited by examiner

MICROELECTRONIC COMPLEX HAVING CLUSTERED CONDUCTIVE MEMBERS

CROSS-REFERENCE TO RELATED APPLICATION

The above-referenced application is based on provisional patent application No. 60/343,219, filed on Dec. 31, 2001.

FIELD OF THE INVENTION

The invention relates to the field of microelectronic complexes. More specifically, the invention is directed to a method and apparatus for providing reduced thermal expansion effects on the external connectivity of a microelectronic complex, such as a semi-conductor wafer. The term "external connectivity" refers to connections between the microelectronic complex and an external or outside substrate, such as a circuit board.

BACKGROUND OF THE INVENTION

The evolution of integrated circuit (IC) fabrication technology has made possible the fabrication of microelectronic complexes, which perform a wide variety of functions and are characterized by varying degrees of complexity. Microelectronic complexes, that is systems and groups of discrete microelectronic functional modules, implement an important range of electronic devices, including microcomputers and microprocessors, and have important application in the design of electronic systems. Examples of such microelectronic complexes include Large Area Integrated Circuits (LAICs), such as semi-conductor wafers, containing a plurality of integrated circuits, as well as integrated circuits containing a plurality of microelectronic components.

The starting material for modern integrated circuits is very-high-purity silicon. The material is grown as a single crystal, which takes the shape of a solid cylinder. This cylindrical crystal is sawed to produce wafers, which are 10 to 30 cm in diameter and 200 μm thick. Certain variable properties of the crystal, notably the direction in which the crystal was crown and the number and type of impurities present, determine the basic electrical and mechanical properties of the wafer. In order to form integrated circuits on a wafer, the electrical properties of the silicon, in particular its resistivity, can be controllably altered through doping, a process by which impurities are purposely added to the pure silicon. The ability to control the doping of silicon permits the formation of diodes, transistors, and resistors in integrated circuits on the wafer.

A finished silicon wafer may contain from 100 to 1000 finished circuits. Normally, a wafer is then diced into chips, where this dicing permits the removal of defective regions. The chips are then packaged using known techniques. The resulting chip normally includes hundreds, if not thousands, of connectors, pins and wires, among other possibilities, for external connection to a circuit board, permitting signals to be exchanged between the circuits/chips and the circuit board.

A well-known problem in the field of Wafer-Scale Integration (WSI) technology is the impact of thermal expansion on external connectivity. More specifically, when a WSI microelectronic complex is connected to a circuit board by thousands of, for example, connectors positioned between the microelectronic complex and the circuit board, these connectors can be damaged due to the different rates of thermal expansion experienced by the surfaces of the microelectronic complex and the circuit board.

Taking for example a finished silicon wafer, packaged in a material such as ceramic, the wafer typically expands at a rate of 3 ppm/C. In contrast, the material of the circuit board typically expands at a rate of 20-40 ppm/C. Thus, as the two materials heat up, the two surfaces will expand at different rates, potentially damaging many of the connectors distributed between the wafer and the circuit board.

Although the impact of thermal expansion is generally known to affect the external connectivity of all different types of microelectronic complexes, it is most noticeable for LAICs characterized by dense signal interconnects requiring small and precise connections between the LAIC and the circuit board. Certain external connections between the LAIC and the circuit board, such as the power and ground wires, are larger and thus typically allow for the use of mechanical attachments, such as springs, to compensate for the difference in thermal expansion rate between materials.

Existing solutions to the problem of thermal expansion include the use of a sheet of compliant material for interfacing between the connectors of the LAIC package and the circuit board. The LAIC package has a single connection to the sheet of material, which is attached to all of the connectors of the LAIC and has the same rate of thermal expansion as the circuit board. Thus, the sheet of material "absorbs" the difference in thermal expansion between the circuit board and the LAIC package, reducing damage to the connectors caused by thermal expansion. Unfortunately, the use of additional material for interfacing between the LAIC and the circuit board is an expensive solution, which reduces the yield of the LAIC. Further, the sheet of material typically interferes with cooling of the LAIC, where such cooling is required to prevent overheating of the LAIC.

Another existing solution involves the packaging of the LAIC in a ceramic package, where the LAIC is connected on a ceramic board which itself is mounted to the circuit board. The ceramic board is characterized by a thermal expansion coefficient value that is intermediate the thermal expansion coefficient values of the LAIC and the circuit board, for reducing the effects of thermal expansion on the connectivity between the LAIC and the circuit board. Unfortunately, interfacing the LAIC and the circuit board with a material of intermediate thermal expansion does not solve the problem, but rather simply delays the impacts of thermal expansion on the connections. Although the use of a ceramic board initially renders the external connectivity of the LAIC stronger, the damage by thermal expansion will typically still occur over time.

Thus, existing solutions to reduce the damage caused by thermal expansion to the external connectivity of microelectronic complexes typically require the use of additional material for interfacing or buffering between the microelectronic complex and the circuit board. Such solutions obviously increase the cost associated with the manufacture of microelectronic complexes and/or the mounting of microelectronic complexes to circuit boards, and may also be detrimental to the quality of the external connectivity between the microelectronic complex and the circuit board.

Against this background, a need exists in the industry for an improved method and apparatus providing a reduction in thermal expansion effects on the external connectivity of a microelectronic complex.

SUMMARY OF THE INVENTION

According to a broad aspect, the invention provides a microelectronic complex including a body of semi-conductor material containing an integrated circuit, and a plurality of contact pads on the body for receiving signal conducting members for connection to an external substrate. The contact pads allow signals to be exchanged between the integrated circuit and the external substrate via the signal conducting members. A majority of the contact pads are disposed on the body of semi-conductor material according to a configuration whereby the stress effects on the signal conducting members caused by thermal expansion mismatch between the microelectronic complex and the external substrate are substantially reduced.

In a specific configuration, a majority of the contact pads form a cluster circumscribing a predetermined area of the body of semi-conductor material, where the size of the area circumscribed by the cluster is determined by the number of contact pads to be contained within the area, as well as the minimum inter-pad distance required to prevent signal cross-over and distortion. In a specific example of implementation, the area circumscribed by the cluster of contact pads is no greater than 900 mm$^2$.

In order to prevent breakage of the body of semi-conductor material, a support unit is provided to support the body of the microelectronic complex over a major portion of its area. In a specific example of implementation, the microelectronic complex is hermetically sealed in a package of material, such as ceramic, where this package is slightly larger than the body of the microelectronic complex in order to provide a space around the body of the microelectronic complex within the package. A major portion of this space is filled with a heat conducting fluid, such as silicon grease, that cushions the microelectronic complex and permits free movement of the body of the microelectronic complex within the package.

Advantageously, by grouping the contact pads, and thus the signal conducting members, together and containing them in a small area, the effects caused by the difference in thermal expansion between the material of the microelectronic complex and the material of the external substrate should typically not be large enough to cause any damage to the signal conducting members, nor to either of the contact pads on the semi-conductor body and the corresponding attachments on the external substrate. The provision of a mechanical support protects the microelectronic complex, in particular providing shock resistance.

For the purposes of the present application, a wafer is considered to be a thin slice of semi-conductor material, used as a base for an electronic component or circuit. A finished wafer includes at least one integrated circuit, and possibly thousands of integrated circuits, metallization having been performed on the wafer to interconnect the various components of the integrated circuit(s) (transistors, resistors, etc.).

Also for the purposes of the present application, a chip is considered to be a small piece of semi-conductor material that forms the base for an integrated circuit, enclosed in a package of material, such as ceramic, which is sealed under vacuum or in an inert atmosphere. A finished wafer may be diced into hundreds or thousands of chips, which are then packaged, each chip being rectangular in shape, typically between 1 and 20 mm on each edge.

According to another broad aspect, the invention provides a method for fabricating a microelectronic complex. The method includes the steps of providing a body of semi-conductor material, forming an integrated circuit on the body, and positioning a plurality of signal conducting members on the body for connection to an external substrate. The positioning of the signal-conducting members on the body is effected according to a specific configuration whereby the stress effects on the signal-conducting members caused by thermal expansion mismatch between the body and the external substrate are substantially reduced.

According to yet another broad aspect, the invention provides a method for computing the layout of contact pads on a body of semi-conductor material, for use during the manufacture of wafers, where a wafer includes a body of semi-conductor material containing an integrated circuit and contact pads through which the integrated circuit can exchange signals with an external entity. The method includes the steps of computing a layout of the contact pads on the body of a wafer by taking into account thermal expansion effects of the body, and using the computed layout to produce contact pads on a plurality of bodies to form a plurality of wafers.

BRIEF DESCRIPTION OF THE DRAWINGS

These and other features of the present invention will become apparent from the following detailed description considered in connection with the accompanying drawings, of which.

Figure 1:
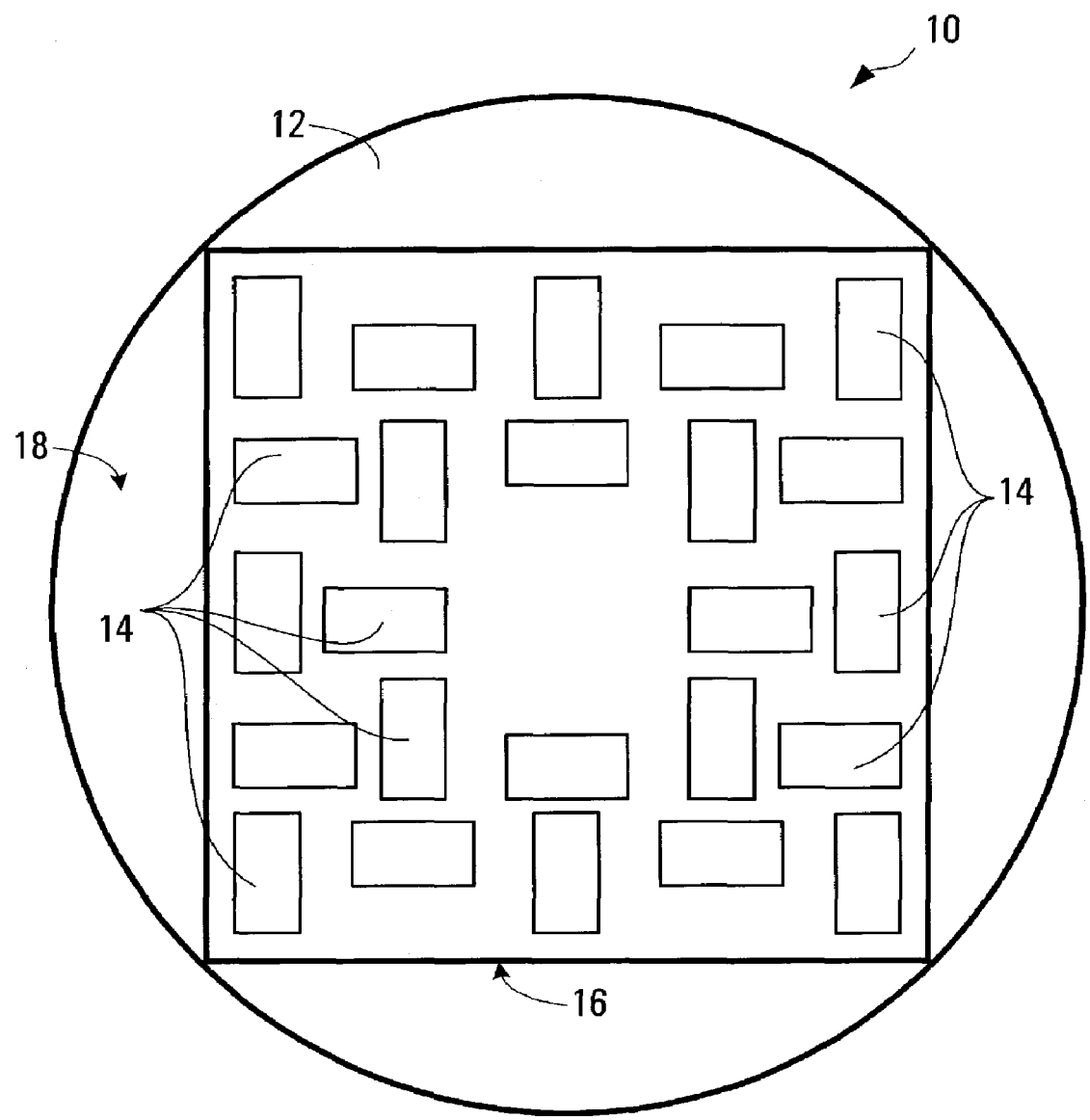
FIGS. 1 and 2 are top views of a wafer constructed in accordance with an example of implementation of the present invention.

In the drawings, embodiments of the invention are illustrated by way of example. It is to be expressly understood, however, that the drawings are provided only for purposes of illustration and as an aid to understanding, and are not intended to be a definition of the limits of the invention, for which reference should be made to the appending claims.

DETAILED DESCRIPTION

FIG. 1 illustrates a top view of a wafer 10, one example of a typical microelectronic complex, constructed in accordance with a non-limiting example of implementation of the present invention. The wafer 10 is formed of a body of semi-conductor material 12 containing a plurality of discrete functional modules 14. In this example of implementation, discrete functional modules 14 include chips and integrated circuits.

The body of semi-conductor material 12 is made of any suitable material that has the requisite electrical properties and mechanical strength, such as silicon, germanium or gallium arsenide, and may be of any size or shape. In the example of FIG. 1, the semi-conductor material of body 12 is silicon, the body 12 characterized by a circular shape as a result of the cylindrical shape of the silicon crystal from which the wafer 10 was sliced. Typically, body 12 would be 10 to 30 cm in diameter and less than 1 mm thick.

The discrete functional modules 14, whether formed in the material of body 12 (integrated circuits) or mounted on the body 12 (chips), are dispersed within a dedicated area 16 of the body 12. Alternatively, the discrete functional modules 14 may be dispersed across the entire surface area of body 12. The methods and techniques used to form integrated circuits in the material of body 12, such as oxidation, diffusion, ion implantation and chemical vapor deposition, have been well documented and are well known in the art. As such, these methods and techniques will not be described in further detail.

Figure 2:
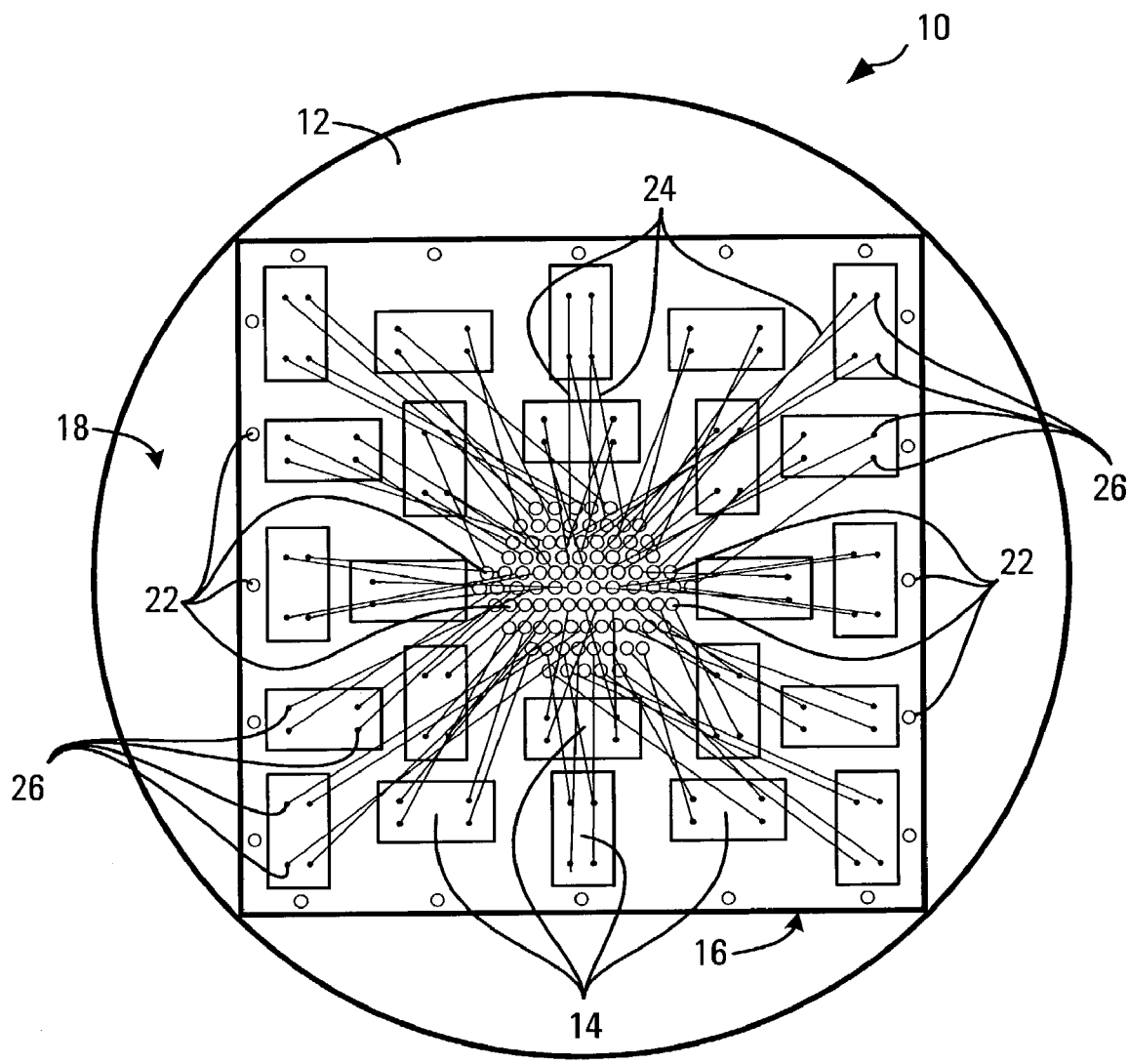

The wafer 10 has first and second surfaces, the first surface 18 being shown in FIG. 1. A plurality of contact pads 22 are mounted on this first surface 18, as shown in FIG. 2. These contact pads 22 are adapted to receive Input/Output (I/O) signal conducting members (not shown in FIG. 2) for connection to an external substrate, such as a circuit board. Each contact pad 22 is associated with a functional module 14 of the wafer 10, where several contact pads 22 may be associated with different components of the same functional module 14. Fine wires 24 may be used to interconnect the contact pads 22 and the various points of connection 26 for the functional modules 14. These wires 24 may be attached through standard techniques, such as wire bonding, or may be implemented by a redistribution layer, such as that used in high-density chip packaging to expand small peripheral Input/Output (I/O) areas to larger pin arrays. In a specific example of implementation, the wafer 10 is constructed using flip-chip technology, and the contact pads 22 are solder balls or bumps positioned on the surface 18 of wafer 10. The concept of flip-chip technology is well known to those skilled in the art, has been well documented and, as such, will not be described in further detail.

Alternatively, the contact pads 22 may be mounted on the second surface (not shown in FIG. 2) of the wafer 10. In one example, tiny wires are mounted to additional pads mounted around the perimeter of the wafer 10, were these tiny wires are bonded to the contact pads 22 on the second surface for interconnecting the points of connection of functional modules 14 on the first surface 18 to the contact pads 22.

Thus, the contact pads 22 on the surface 18 of semi-conductor body 12 allow signals to be exchanged between the functional modules 14 and the external substrate via the signal conducting members.

Examples of signal conducting members include connectors, pins and wires, among other possibilities. These signal conducting members are characterized by a high level of conductivity for transmitting signals between the contact pads 22 and the external substrate, where such signals may include electrical and/or optical signals.

Specific to the present invention, the layout of the contact pads 22 on the body 12 of the wafer 10 is computed specifically to overcome thermal expansion effects of the semi-conductor material of the body 12. Thus, all or a majority of the contact pads 22 are disposed on the surface 18 of the wafer body 12 according to a particular configuration, designed to significantly reduce the stress effects on the contact pads 22 and corresponding signal conducting members caused by thermal expansion mismatch between the wafer 10 and the external substrate.

As seen in FIG. 2, certain contact pads 22 are distributed around the periphery of the dedicated area 16. These contact pads 22 are designated to receive low-density macroscopic signal conducting members, such as power and ground wires, which are limited in number and thus allow for the use of mechanical attachments, such as springs, to compensate for the difference in thermal expansion rate between the material of the wafer 10 and the material of the external substrate.

Figure 3:
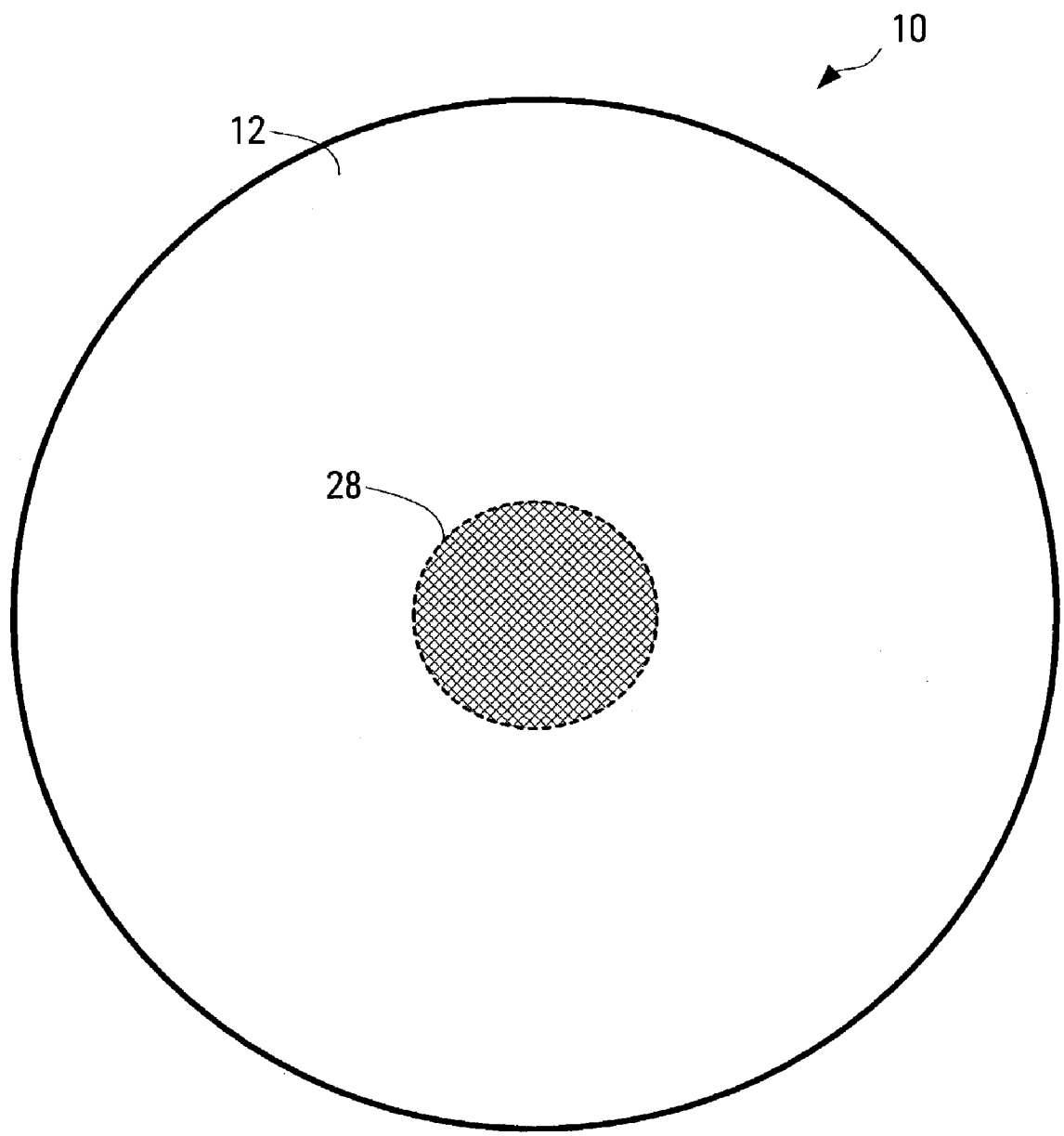
FIG. 3 is a simplified top view of the wafer shown in FIG. 1, illustrating the cluster area.

With reference to the example shown in FIGS. 2 and 3, the majority of the contact pads 22 form a small cluster circumscribing a predetermined area 28 of the body 12, where this cluster is located at a central portion of the body 12. The contact pads 22 within the cluster are designated to receive high-density signal conducting members characterized by substantially rigid microscopic connectivity, such as standard I/O connections between the wafer 10 and the external substrate.

The cluster is formed by minimizing the inter-pad distance between contact pads 22, such that the area 28 is as small as possible. The minimum size of the area 28 is determined by the number of contact pads 22 to be contained within the area 28, as well as the minimum inter-pad distance required to prevent signal cross-over and distortion. In a specific example of implementation, the area 28 circumscribed by the cluster of contact pads 22 is no greater than 900 $mm^2$, which corresponds approximately to the surface area of a chip manufactured using today's standard chip packaging technology.

Note that the layout of contact pads 22 on the wafer 10 according to the present invention is preferably applicable to wafers including between 100 and 10 000 contact pads 22 designated to receive signal conducting members characterized by substantially rigid microscopic connectivity.

Figure 4:
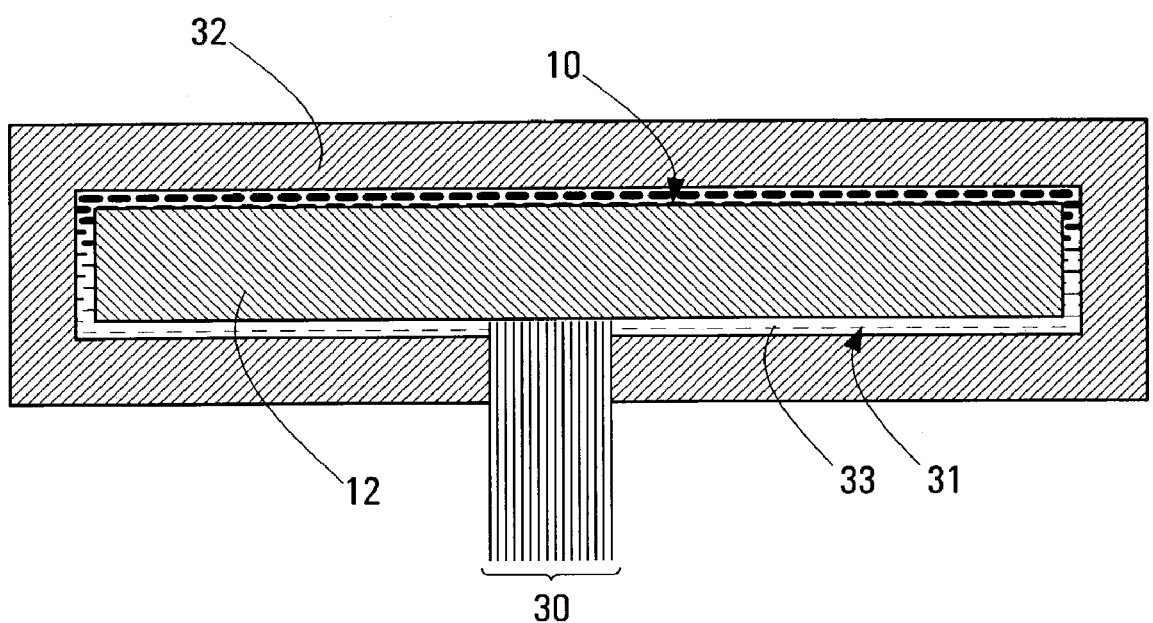
FIG. 4 is a side view of the wafer shown in FIGS. 1 and 2.

Assuming for example that the microscopic signal conducting members received by the majority of contact pads 22 are pins, FIG. 4 is a side view of the wafer 10, showing the pins 30 grouped together in a cluster at the central portion of the body 12. Note that, in the interest of clarity, the macroscopic signal conducting members received by certain designated contact pads 22 distributed around the periphery of the wafer 10 are not shown in FIG. 4.

The wafer 10 includes a support unit to support the body 12 of the wafer 10 over a major portion of its area. Since the majority of the contact pads 22, and thus the signal conducting members, are grouped in a cluster at a central portion of the body 12, the body 12 is more vulnerable to breakage, for example as a result of shock impacts. In the example of implementation shown in FIG. 4, the support unit is mechanical, formed of a package 32 of ceramic material in which the wafer 10 is enclosed and hermetically sealed. The package 32 is sized slightly larger than the body 12 of the wafer 10 in order to provide a space 31 around the body 12. A major portion of this space 31 is filled with a heat conducting fluid 33, that cushions the wafer 10 and permits free movement of the body 12 within the package, for example during thermal expansion or contraction.

The pins 30 extend through the package 32 for connection to an external substrate. The packaging of semi-conductor wafers in ceramic material is well known to those skilled in the art, and will not be described in further detail.

In one example, the heat conducting fluid 33 is silicon grease, where the space 31 permits the provision of a layer of between 0.5 and 5 mm of silicon grease around the wafer body 12.

Note that alternative types of suitable heat conducting fluid 33 exist and may be used to fill in the space 31 for cushioning the wafer 10. Further, variant types of support units are known and documented in the art, and may be used to protect the wafer 10 from breakage, more particularly to increase the shock resistance of wafer 10. Preferably, the support unit is not bonded to the body 12 of wafer 10, such that it flexibly supports the body 12 while permitting expansion and contraction of the body 12.

By grouping the majority of contact pads 22 together and containing them in a small area 28, the corresponding substantially rigid signal conducting members, once received by the contact pads 22, will also be grouped closely together and contained within the small area 28. Thus, once the wafer 10 is mounted to an external substrate, the effects on the rigid signal-conducting members caused by the difference in thermal expansion between the material of the wafer 10 and the material of the external substrate will be constrained to those arising within the area 28 of the wafer-10. Since a plurality of rigid signal conducting members are contained within the relatively small area 28, the thermal expansion effects should typically not be large enough to cause any damage to the rigid signal conducting members, nor to the contact pads 22 or the corresponding attachments on the external substrate.

Note that as the inter-pad distance between the contact pads 22 on the body 12, and thus the diameter of the cluster area 28, is reduced, the thermal expansion effects on the external connectivity of the wafer 10 are reduced. The thermal expansion effects are minimized at the minimum possible diameter of the cluster area 28.

Assume that, during a process for manufacturing wafers, both the number of contact pads 22 to be mounted on a particular wafer 10 for receiving substantially rigid microscopic signal conducting members, and the minimum possible inter-pad distance on the particular wafer 10, are known. Accordingly, the minimum diameter of the cluster area 28 of contact pads 22 on the body 12 of the particular wafer 10 can be computed, and used to determine an optimum layout for the contact pads 22 on the wafer 10. Subsequently, the manufacturing process can produce a plurality of substantially identical wafers, each wafer having contact pads disposed on the wafer body according to the predetermined optimum layout.

Note that for different shapes of cluster area 28, the cluster area 2 may be characterized by one or more different diameters. In any case, the cluster is formed such that the longest diameter of the cluster area 28 is minimized.

Figure 5:
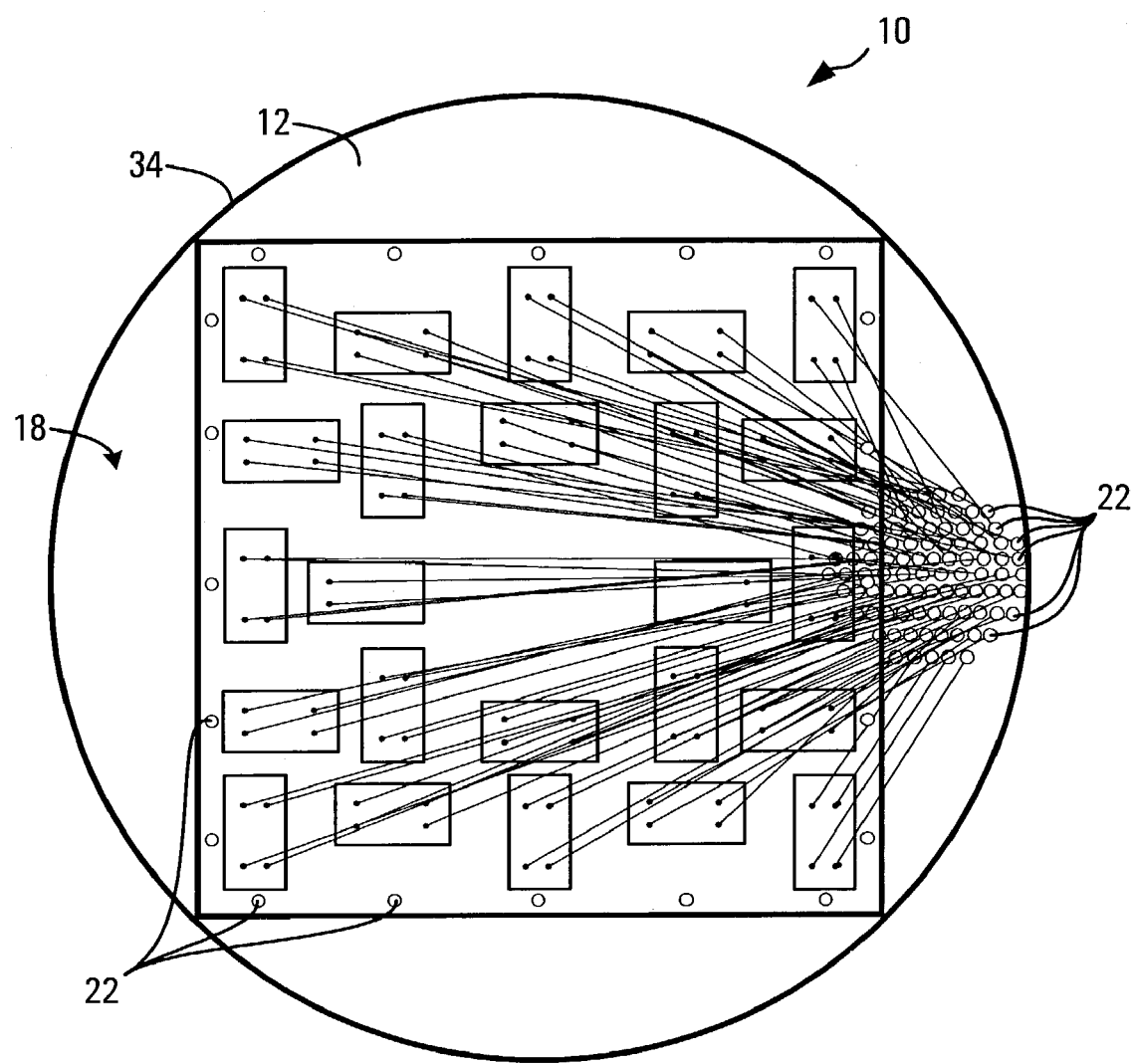
FIG. 5 is a top view of a wafer constructed in accordance with a different example of implementation of the present invention.
Figure 6:
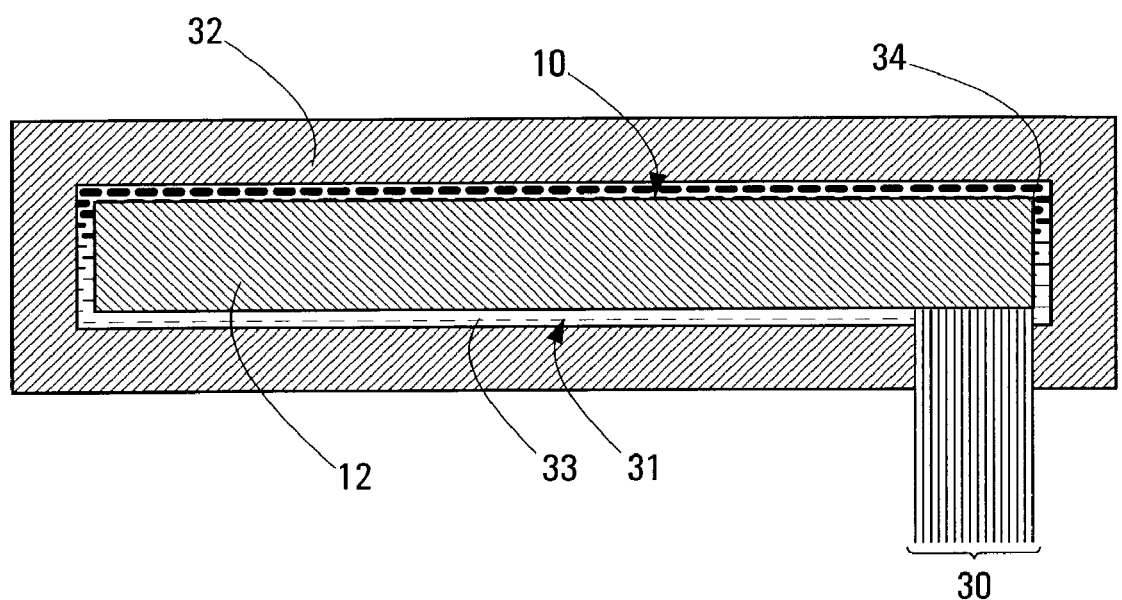
FIG. 6 is a side view of the wafer shown in FIG. 5.

In a variant example of implementation shown in FIG. 5, the cluster of contact pads 22, and thus of signal conducting members, is located adjacent a periphery 34 of the body 12. FIG. 6 is a side view of the wafer 10 shown in FIG. 5, assuming for example once again that the signal conducting members received by the contact pads 22 are pins 30. In the interest of clarity, the macroscopic signal conducting members received by certain designated contact pads 22 distributed around the periphery of the wafer 10 are not shown in FIG. 6. Note that other locations for the cluster of contact pads 22 on the body 12 are also possible, without departing from the scope of the invention.

Figure 7:
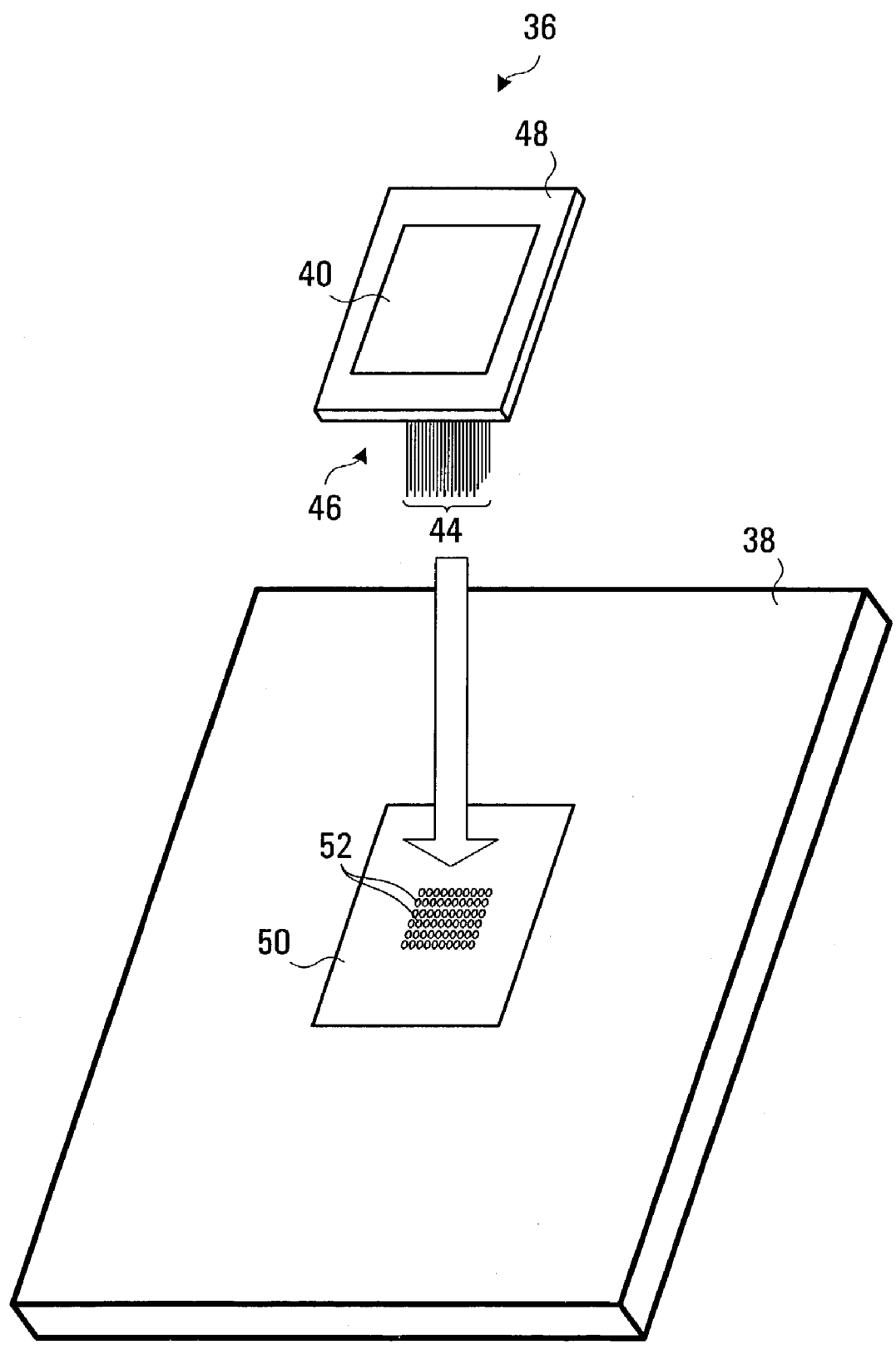
FIG. 7 is an exploded view of a wafer and circuit board combination, according to an example of implementation of the present invention.

In a specific example shown in FIG. 7, a wafer 36 is to be mounted to a circuit board 38. The wafer 36 includes a semi-conductor body 40 containing a plurality of integrated circuits, and is manufactured using flip-chip technology. Note that, since the wafer 10 is manufactured using flip-chip technology, the integrated circuits are not seen in FIG. 7, as they are formed on the circuit board facing surface 46 of the wafer 36. A plurality of signal conducting members 44, in this example pins, are disposed on the circuit board facing surface 46 of the wafer 36, for connecting the wafer 36 to the external circuit board 38. The pins 44 allow for the exchange of signals between the integrated circuits of the wafer 10 and the circuit board 38.

The wafer body 40 is hermetically sealed in a ceramic package 48, which contains silicon grease for forming a protective and shock-resistant layer around the body 40 of wafer 36.

The layout of the pins 44 on the surface 46 of the wafer 36 is such that the pins 44 form a small cluster at the central portion of the wafer 36. The inter-pin distance between pins 44 is minimized, on the basis of a predetermined minimum possible inter-pin distance, such that the longest diameter of the cluster area is as small as possible for the number of pins 44 to be contained within the cluster.

The circuit board 38 defines a dedicated area 50 for receiving the wafer 36, the dedicated area 50 including a plurality of apertures 52 for receiving the pins 44, where each aperture 52 is associated with one of the pins 44 on the wafer 36. The apertures 52 define a configuration that matches the configuration of the pins 44 on the wafer 36. More specifically, the apertures 52 are laid out on the circuit board 38 such that they circumscribe an area matching the cluster area circumscribed by the pins 44.

As a result of the cluster layout of the pins 44 on the wafer 36, and the corresponding cluster layout of the apertures 52 oh the circuit board 38, once the wafer 36 is mounted to the circuit board 38, any effects arising due to the difference in thermal expansion between the material of the wafer 36 and the material of the circuit board 38 should not be large enough to damage the pins 44, nor the apertures 52.

In a variant example of implementation, the external substrate to which the wafer 10 is to be connected is divided into regions, where certain regions are characterized by built-in flexibility for compensating for thermal expansion effects. Accordingly, the layout of the contact pads 22, and thus the signal conducting members, on the body 12 of the wafer 10 is computed such that a majority of the substantially rigid, microscopic signal conducting members are concentrated within specific regions on the surface of the wafer 10 that correspond to the flexible regions of the external substrate. The concentrations of signal conducting members are formed by clustering together a group of contact pads 22, such that each cluster circumscribes the smallest area possible of the body 12 of wafer 10, as described above.

Although several embodiments have been illustrated, this was for the purpose of describing, but not limiting, the invention. Various modifications will become apparent to those skilled in the art and are within the scope of this invention, which is defined more particularly by the attached claims.

The invention claimed is:

1. A combination, comprising:
   a) a substrate;
   b) a microelectronic complex including a body of semiconductor material containing an integrated circuit, said body having a first area;
   c) a plurality of signal conducting members on said body for connecting said microelectronic complex to said substrate, said signal conducting members allowing signals to be exchanged between said integrated circuit and said substrate, a majority of said signal conducting members being disposed on said body to form a cluster circumscribing a second area of said body, said second area being less than one quarter of said first area such that stress effects on said signal conducting members caused by thermal expansion mismatch between said microelectronic complex and said substrate are significantly reduced.

2. A combination as defined in claim 1, wherein said second area is smaller than 900 mm².

3. A combination as defined in claim 1, wherein said cluster is characterized by a reduced inter-pad distance among said majority of contact pads on the body of said microelectronic complex.

4. A combination as defined in claim 1, wherein said cluster is characterized by a minimum inter-pad distance among said majority of contact pads on the body of said microelectronic complex.

5. A combination as defined in claim 1, wherein said body has a central portion, said cluster being located at said central portion.

6. A combination as defined in claim 1, wherein said body includes a periphery, said cluster being adjacent said periphery.

7. A combination as defined in claim 1, wherein said combination includes a support unit for supporting a major portion of said body of semi-conductor material.

8. A combination as defined in claim 7, wherein said support unit includes a package of material within which said microelectronic complex is hermetically sealed, said signal conducting members extending through said package for connecting said microelectronic complex to said substrate, said package containing a quantity of heat conducting fluid for surrounding at least a major portion of said body of semi-conductor material.

9. A combination as defined in claim 8, wherein said heat conducting fluid is silicon grease.

10. A combination as defined in claim 8, wherein the material of said package is ceramic.

11. A combination as defined in claim 2, wherein said signal conducting members are selected from the group consisting of pins, wires and connectors.

12. A combination as defined in claim 2, wherein said microelectronic complex comprises a wafer.

13. A combination as defined in claim 2, wherein said substrate comprises a circuit board.

14. A combination as defined in claim 1, wherein said second area is less than 12.5% of the first area.

15. A combination as defined in claim 1, wherein said second area is less than 2.5% of the first area.

16. A combination as defined in claim 1, wherein said majority is more than 50%.

17. A combination as defined in claim 1, wherein said majority is more than 75%.

18. A combination, comprising:
a) a substrate;
b) a microelectronic complex including a body of semi-conductor material containing an integrated circuit, said body having a first area;
c) a plurality of signal conducting members on said body for connecting said microelectronic complex to said substrate, said signal conducting members allowing signals to be exchanged between said integrated circuit and said substrate, more than 75% of said signal conducting members being disposed on said body to form a cluster circumscribing a second area of said body, said second area being less than half of said first area such that stress effects on said signal conducting members caused by thermal expansion mismatch between said microelectronic complex and said substrate are significantly reduced.

19. A combination, comprising:
a) a substrate;
b) a microelectronic complex including a body of semi-conductor material containing a plurality of functional modules;
c) a cluster of signal conducting members on said body for connecting said microelectronic complex to said substrate, said signal conducting members allowing signals to be exchanged between said functional modules and said substrate;
d) wherein the two furthest-spaced-apart signal conducting members in the cluster are more closely spaced than the two furthest-spaced-apart functional modules of the body.

* * * * *